Oct. 13, 1953 W. SHOCKLEY 2,655,609

BISTABLE CIRCUITS, INCLUDING TRANSISTORS

Filed July 22, 1952

INVENTOR
W. SHOCKLEY

BY [signature]

ATTORNEY

Patented Oct. 13, 1953 2,655,609

UNITED STATES PATENT OFFICE 2,655,609

BISTABLE CIRCUITS, INCLUDING TRANSISTORS

William Shockley, Madison, N. J., assignor to Bell Telephone Laboratories, Incorporated, New York, N. Y., a corporation of New York Application July 22, 1952, Serial No. 300,220

13 Claims. (Cl. 307—88)

This invention relates to semiconductor signal translating devices and more particularly to bistable circuits including semiconductor devices of the type known as transistors.

Transistors of the type known as junction transistors, such as disclosed in Patent 2.569,347, granted September 25, 1951, W. Shockley, comprise generally a semiconductive body, for example of germanium or silicon, having therein a zone of one conductivity type, N or P, between and contiguous with two zones of the opposite conductivity type. Emitter and collector connections are made respectively to the outer zones, and a third connection, termed the base, is made to the intermediate zone. The several zones define two junctions, which will be referred to herein as the emitter and collector junctions. In general, in the operation of the devices, the collector junction is biased in the reverse or high resistance direction and the emitter junction is biased in the forward or low resistance direction.

Normally, that is for zero or small voltages impressed between the end zones of a transistor of the general construction described, the impedance between terminals on these zones is very high. Also for such devices, the current multiplication factor is relatively small, approaching unity as a limit.

One general object of this invention is to obtain novel and improved performance characteristics for circuit elements including transistors. More specific objects of this invention are to realize relatively high current multiplication factors for translating devices including transistors, to enable ready control of the impedance presented between the outer zones of junction transistors, and to provide a bistable, symmetrical transistor circuit facilely transferable from a low current or open circuit state to a high current or closed circuit state.

In accordance with one feature of this invention, a pair of transistors of unlike conductivity type are associated to constitute a circuit element having novel advantageous characteristics.

More specifically, in accordance with one feature of this invention, a pair of junction transistors, one of NPN and the other of PNP configuration are interconnected with the base of each tied to the collector of the other and the emitters each connected to a respective one of a pair of terminals. The combination, as will be developed hereinafter, constitutes an equivalent transistor having a current multiplication factor substantially greater than that of either of the component units.

Further, for voltages impressed between the terminals noted, below a certain value, both the individual transistors and the combination are in a low current condition. However, for voltages of at least a certain magnitude, the devices transfer abruptly to a high current state. Thus, the combination is particularly useful as a circuit controlling element or switch transferable from an open circuit to a closed circuit state upon application of a voltage of prescribed amplitude between the terminals. The device is bidirectional having substantially the same transmission properties in both directions and, further, introduces substantially negligible loss in a circuit connected between the terminals.

In accordance with another feature of this invention, means are provided for presetting precisely the voltage requisite to trigger the device from the low current to the high current condition. Specifically, in accordance with one feature of this invention, a semiconductor diode having a prescribed Zener voltage is connected across one of the junctions in the transistors and poled in the reverse direction for voltages of the normal polarity impressed between the terminals aforenoted. Such diodes and their characteristics are disclosed in detail in the application Serial No. 211,212, filed February 16, 1951, of W. Shockley.

The invention and the above noted and other features thereof will be understood more clearly and fully from the following detailed description with reference to the accompanying drawing in which.

Figure 1:
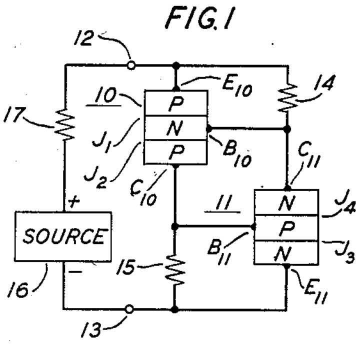
Fig. 1 is a diagram representing one illustrative embodiment of this invention.
Figure 5:
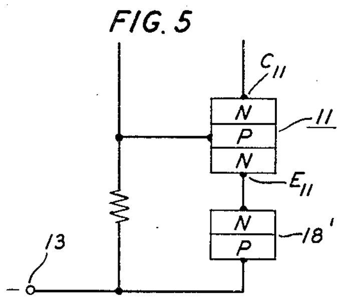
Figure 6:
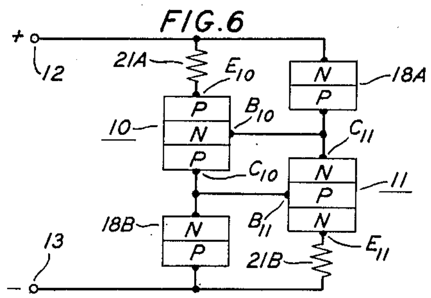
Figure 7:
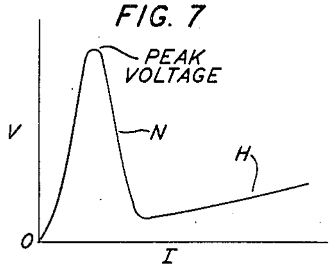
Figure 8:
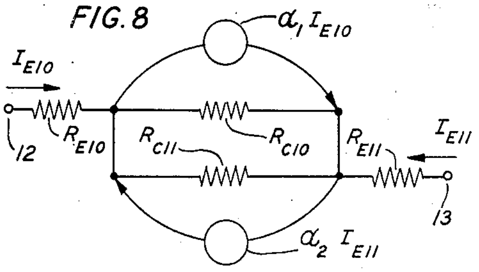

Fig. 5 portrays a modification of the embodiment shown in Fig. 1, especially suitable for the attainment of low saturation currents;

Fig. 6 illustrates another embodiment of this invention characterized particularly by a constant current characteristic;

Fig. 7 is a graph representing a typical characteristic of a circuit controlling element or switch constructed in accordance with this invention; and Fig. 8 is a diagram of an equivalent circuit which will be referred to hereinafter in an analysis of devices constructed in accordance with this invention.

Referring now to the drawing, the device illustrated in Fig. 1 comprises a pair of junction transistors 10 and 11 connected between a pair of terminals 12 and 13 each through a respective series resistor 14 or 15. One of the transistors, 10, is of PNP configuration and comprises an emitter $E_{10}$, a base $B_{10}$ and a collector $C_{10}$; the other, 11, is of NPN configuration and comprises an emitter $E_{11}$, a base $B_{11}$ and a collector $C_{11}$. The former has emitter and collector junctions $J_1$ and $J_2$ respectively and the latter has emitter and collector junctions $J_3$ and $J_4$ respectively. Both transistors advantageously are of single crystal construction, the semiconductive body thereof being of germanium or silicon fabricated, for example, in the manner disclosed in the application Serial No. 234,408, filed June 29, 1951, of E. Buehler and G. K. Teal. Also advantageously the two transistors have substantially the same performance characteristics, except, of course, for the difference in polarities.

A source 16, poled as shown in the drawing, is connected between the terminals 12 and 13 in series with a load represented by the resistor 17. The terminals 12 and 13 may be, for example, the cross points in a telephone switching system.

It can be shown readily that the combination of two transistors associated as shown in Fig. 1 and with the resistors 14 and 15 omitted is substantially equivalent circuitwise to the circuit portrayed in Fig. 8. In this figure, $R_{E10}$ and $R_{E11}$ are the resistances of the emitter junctions $J_1$ and $J_3$ respectively and $R_{C10}$ and $R_{C11}$ are the resistances of the collector junctions $J_2$ and $J_4$ respectively. $\alpha_1$ and $\alpha_2$ are the current multiplication factors of the transistors 10 and 11 respectively whereby the equivalent circuit comprises two current generators $\alpha_1 I_{E10}$ and $\alpha_2 I_{E11}$ each bridged across the respective collector junction.

For the case of $E_{10}$ operated as the emitter terminal, $E_{11}$ as the collector terminal and $B_{10}$ as the base terminal, it can be shown that the combination of two transistors shown in Fig. 1 and represented in Fig. 8 constitutes an equivalent transistor having an equivalent current multiplication factor, $\alpha$, given by the relation $$\alpha=\frac{\alpha_1}{1-\alpha_2}$$

From this it will be apparent, bearing in mind that both $\alpha_1$ and $\alpha_2$ inherently are less than unity, that the current multiplication factor $\alpha$ for the combination is substantially greater than that for either transistor 10 or 11 alone. For example, if $$\alpha_1=\alpha_2=0.9, \text{ then } \alpha=9$$

The collector resistance $R_c$ for the equivalent transistor is given by the equation $$R_c=\frac{R_{c10}R_{c11}}{R_{c10}+R_{c11}}$$

Referring again to Fig. 1, it will be noted that for the polarity shown of the source 16, at least one reversely biased junction is included in every current path that can be traced between the terminals 12 and 13 and through the transistors. For example, for the polarity of the source 16 indicated in the figure, the junctions $J_2$ and $J_4$ are biased in the reverse or high resistance direction and at least one of the junctions is included in any current path through the combination. Normally, then, it is evident that the combination of transistors 10 and 11 presents a high impedance between the terminals 12 and 13, that is in the low current or open circuit condition or state.

But brief quasiempirical analysis of the circuit of Fig. 1 will suffice to establish that the combination of the two transistors is stable in the low current condition and further that it has also a stable high current condition. At low currents, the potential drops across the resistors 14 and 15 are negligible so that the emitter bias for each transistor 10 and 11 is substantially zero. For example, in a typical case, the collector saturation currents of the transistors 10 and 11 may be of the order of $10^{-5}$ amperes. If the resistors 14 and 15 are 100 ohms each, for example, for the collector saturation current noted the drop across each resistor will be but $10^{-3}$ volts, providing so small an emitter bias that no instability results.

If the voltage between the terminals 12 and 13 is increased, the currents passed by the reversely biased junctions will increase. This current passes through the resistors 13 and 14 whereby the bias on the emitters $E_{10}$ and $E_{11}$ each with respect to the corresponding base $B_{10}$ or $B_{11}$ increases. For example, if the current through the combination is of the order of 20 milliamperes and the transistors each have an $\alpha$ of 0.8 or greater, the drop across the resistors 13 and 14 will be of the order of one volt and a substantial forward bias is placed on the emitter of the transistors. The resulting increase in emitter current produces a change in the collector current and this in turn effects a change in the emitter bias with a consequent change in the emitter current. The combination passes through an unstable state to a stable high current condition. Roughly, the latter state is one at which the resistances of the transistors 10 and 11 and of the resistors 14 and 15 are comparable. More specifically, the current requisite to maintain the combination in the high current state is substantially that necessary to provide voltage gain around the loop from $B_{10}$ to $C_{10}$ to $B_{11}$ to $C_{11}$. To a first approximation this condition is achieved when there is voltage gain from base to collector in each transistor. This condition corresponds approximately to $gR>1$ where $g$ is the transconductance and R the load. For a junction transistor, the transconductance is approximately proportional to the collector current for normal operating conditions. This leads to the result that the current through each transistor required to maintain the combination in the high current condition is approximately $$I=\frac{I_0}{g_{11}R_{14}}$$

where $I_0$ is the collector saturation current for transistor 11 when the emitter-base bias is zero,
$g_{11}$ is the transconductance of transistor 11 for zero emitter base bias, and
$R_{14}$ is the resistance of resistor 14.

The current voltage characteristic of the combination of transistors 10 and 11, both voltage and current being measured between the terminals 12 and 13, is portrayed graphically in Fig. 7. As there shown, as the voltage V is increased from zero the current increases slightly until a "peak voltage" is reached and the resistance evidently is large. When the peak voltage is reached, the device passes abruptly from the low current high resistance state, through a negative resistance region N and to a high current low resistance state H.

Thus, it will be seen that the combination of transistors illustrated in Fig. 1 in effect may be triggered from a substantially open circuit (low current) condition to a closed circuit (high current) condition by application of a voltage of prescribed magnitude, the peak voltage, between the terminals 12 and 13.

Figure 2:
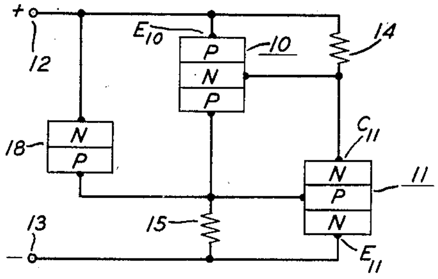
Figs. 2, 3 and 4 depict other embodiments of this invention including Zener diodes associated with the transistors.

The voltage or current requisite to effect transfer of the combination of Fig. 1 from the open circuit to the closed circuit state is dependent upon a number of factors, such as the alpha, the collector resistance and the emitter and collector currents, and the relation of these factors. However, in accordance with one feature of this invention, the point at which the circuit will trigger is preset precisely at a desired value. Specifically, in one embodiment illustrated in Fig. 2, a semiconductor junction diode 18, for example of germanium or silicon, is connected in series with the resistor 15, between the terminals 12 and 13. This diode, as indicated in Fig. 2, is poled in the reverse direction for the polarity of voltage applied between the terminals. Also, the diode has a preassigned Zener voltage. As is known, below this voltage the reverse current through the diode is very small but when this voltage is reached the current increases abruptly. Thus, when a voltage sufficient to place the diode 18 in the Zener range is impressed between the terminals 12 and 13, a large current flows through the resistor 15 and a substantial forward bias is applied to the emitter $E_{11}$ of transistor 11 and the collector current of the latter becomes substantial. Consequently, the drop across resistor 14 is increased thereby to raise the bias of the emitter $E_{10}$ of transistor 10 whereby the latter is placed in the high current condition. Thus, when the Zener voltage obtains across the diode 18, the combination of transistors 10 and 11 is, in effect, triggered from the open circuit to the closed circuit condition.

Figure 3:
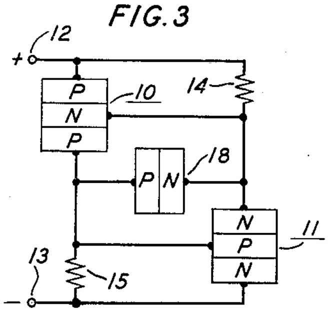

In the embodiment of this invention portrayed in Fig. 3, the diode 18 is connected in series with both the resistors 14 and 15 so that when the voltage between terminals 12 and 13 is such as to establish the Zener voltage across the diode, the resultant large current, which flows through both resistors 14 and 15, produces biases on the emitters of both transistors to transfer both transistors, and the combination thereof, from the low current to the high current condition.

It may be noted that in the embodiments of the invention thus far described, once the device is triggered to the high current or closed circuit condition, it will remain in that condition until the voltage between terminals 12 and 13 is reduced to substantially zero. Also it may be noted that in the embodiments illustrated in Figs. 2 and 3 the device can be made to trigger at any desired voltage by making the Zener voltage equal to that desired for triggering.

Figure 4:
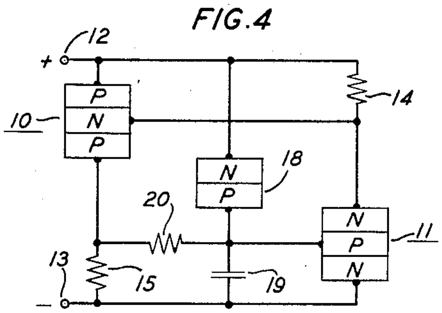

Fig. 4 depicts another embodiment of this invention particularly advantageous for utilization with small exciting currents of short duration. As in the embodiment illustrated in Fig. 2, in that shown in Fig. 4 the Zener diode is in series with the resistor 15. However, the resistor 15 is bridged by a condenser 19 through a resistor 20. The resistor 15 is made relatively small in comparison to each of resistors 14 and 20 and resistor 14 is made large. Because of the relatively high value of resistor 14 in comparison to its value in embodiments described priorly herein, a greater gain obtains around the loop heretofore noted. When the Zener voltage obtains across diode 18, transistor 11 will be transferred to the high current state as will be evident from the discussion hereinabove, and the combination of transistors likewise is triggered to the closed circuit condition. Even though the voltage between terminals 12 and 13 may fall to a low value before the transition to the high current condition has been completed, this condition will be produced because resistor 15 will discharge condenser 19 slowly because of the relatively large value of resistor 20. The voltage drop in the high current condition will be small since a low resistance path is provided through resistor 15. In the embodiment of the invention illustrated in Fig. 5, a Zener diode 18 is connected between each emitter and the respective terminal 12 or 13 and is poled in the reverse direction for voltages of the normal polarity between the terminals 12 and 13. Each diode acts as a high impedance for low emitter voltages so that the collector current at low voltages is decreased. When the Zener voltage obtains across the diode, the latter presents a low impedance. The Zener voltage, of course, should be small and much lower than that requisite to trigger the transistor combination, for example as in Fig. 1, from the low current to the high current condition and in the high current condition the sustaining voltage will be higher than the sum of the voltages of the Zener diodes in the emitter circuits.

The invention may be utilized also to provide a substantially constant current circuit one form of which is illustrated in Fig. 6. As shown in this figure, a Zener diode 18A or 18B is connected between the base and emitter of each of the transistors 10 and 11 through a respective resistor 21A or 21B. In the high current high voltage condition, each of the diodes is biased to its critical voltage which is large compared to the emitter-base bias of each transistor. Consequently the emitter current of transistor 11 is determined by the critical voltage of diode 18B divided by the resistance of resistor 21B. If transistor 11 has a high collector impedance, then the collector current is substantially $\alpha$ times the emitter current and thus has a value independent of the voltage applied between 12 and 13, provided this is large enough to produce the critical voltages across diodes 18A and 18B. The same considerations apply to transistor 10 and the current through the circuit is thus independent of the voltage between terminals 12 and 13. The transition to the high current condition may take place in the same fashion as that described in connection with Fig. 1, if the gain around the feedback loops is low enough. On the other hand, if the diodes 18A and 18B present sufficiently high impedance at low voltage, then the high current situation will prevail even at low voltages and the current will increase monatomically until the critical voltages are surpassed, after which it will saturate.

Although the invention has been described thus far with particular reference to devices including junction type transistors, it may be practiced also by utilizing point contact transistors such as disclosed in Patent 2,524,035, granted October 3, 1950, to J. Bardeen and W. H. Brattain or point-junction transistors or combinations of different type transistors. In this connection it may be noted that an NPN junction transistor is the counterpart circuitwise of a point contact transistor wherein the semiconductive body is of P conductivity type, both devices being properly designated as P type transistors. Similarly, a PNP junction transistor and a point contact one wherein the semiconductive body is of N conductivity type are analogous and properly designated as N type transistors.

Also, although specific embodiments of this invention have been shown and described, it will be understood that they are but illustrative and that various modifications may be made therein without departing from the scope and spirit of this invention.

Reference is made of the applications, Serial No. 300,235, filed July 22, 1952, of J. J. Ebers, and Serial No. 300,181, filed July 22, 1952, of L. B. Valdes, wherein related inventions are disclosed and claimed.

What is claimed is:

1. A signal translating device comprising a pair of transistors of opposite conductivity types and each having a base, an emitter and a collector, means connecting the base of each of said transistors to the collector of the other, and a connection to each emitter.

2. A signal translating device comprising a PNP junction transistor, an NPN junction transistor, each of said transistors having a base, an emitter and a collector, means connecting the base of each transistor to the collector of the other, and a connection to each emitter.

3. A circuit controlling element comprising a pair of transistors of opposite conductivity types and each having a base, a collector and an emitter, means connecting the base of each transistor to the collector of the other, a resistor connected between the base and emitter of each transistor, and a pair of terminals each connected to a respective one of the emitters.

4. A circuit controlling element in accordance with claim 3 comprising a diode connected between said terminals and poled in the reverse direction for voltages applied between said terminals of the polarity to bias each emitter in the forward direction, said diode having a preassigned Zener voltage.

5. A circuit controlling element in accordance with claim 4 wherein said diode is connected between the emitter and collector of one of said transistors.

6. A circuit controlling element in accordance with claim 4 wherein said diode is connected between the collectors of said transistors.

7. A circuit controlling element in accordance with claim 3 comprising a diode connected between each emitter and the respective terminal.

8. A circuit controlling element comprising a PNP and an NPN junction transistor each having a base, a collector and an emitter, means connecting the base of each transistor to the collector of the other, a pair of terminals, a connection from each emitter to a respective one of said terminals, a resistor connected across each emitter junction, and a semiconductor diode in series with at least one of said resistors and connected between said terminals, said diode having a preassigned Zener voltage and poled in the reverse direction for voltages between said terminals of the polarity to bias the emitter in the forward direction.

9. A circuit controlling element comprising a PNP and an NPN junction transistor each having a base, a collector and an emitter, means connecting the base of each transistor to the collector of the other, a pair of terminals, a connection from each emitter to a respective one of said terminals, a resistor connected across each emitter junction, and a semiconductor diode connected between the emitter and collector of one of said transistors and having a preassigned Zener voltage, said diode being poled in the reverse direction for voltages between said terminals of the polarity to bias the emitters in the forward direction.

10. A circuit controlling element in accordance with claim 9 comprising a condenser bridged across the emitter junction of the other of said transistors, and a resistor connected between the base terminals of said condenser and the resistor associated with said emitter junction.

11. A circuit controlling element comprising a PNP and an NPN junction transistor each having a base, a collector and an emitter, means connecting the base of each transistor to the collector of the other, a pair of terminals, a connection from each emitter to a respective one of said terminals, a resistor connected across each emitter junction, and a semiconductive diode connected between the collectors of said transistors, said diode having a preassigned Zener voltage and being poled in the reverse direction for voltages between said terminals of the polarity to bias each emitter in the forward direction.

12. A circuit controlling element comprising an NPN and a PNP transistor each having a base, a collector and an emitter, a pair of terminals, means connecting the base of each transistor to the collector of the other, a pair of resistors each connecting a corresponding emitter to a respective one of said terminals, and a pair of diodes each bridged across the emitter junction of a respective transistor and the resistor associated therewith, each diode having a preassigned Zener voltage and being poled in the direction opposite that of the respective emitter junction.

13. A circuit controlling element comprising a pair of transistors of opposite conductivity type and each having a base, a collector and an emitter, a pair of terminals, means connecting the base of each transistor to the collector of the other, a pair of diodes each connected between one of the emitters and a respective one of said terminals, each of said diodes having a preassigned Zener voltage and being poled in the reverse direction, and a pair of resistors each connected between the base of a respective transistor and the terminal of the respective diode remote from the emitter of the corresponding transistor.

WILLIAM SHOCKLEY.

No references cited.